(12) United States Patent
Woodward et al.

(10) Patent No.: US 7,519,879 B2
(45) Date of Patent: *Apr. 14, 2009

(54) APPARATUS AND METHOD FOR DYNAMIC IN-CIRCUIT PROBING OF FIELD PROGRAMMABLE GATE ARRAYS

(75) Inventors: Joel D Woodward, Colorado Springs, CO (US); Adrian M Hernandez, Colorado Springs, CO (US); James B Stewart, III, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 127 days.

This patent is subject to a terminal disclaimer.

(21) Appl. No.: 10/923,460

(22) Filed: Aug. 20, 2004

(65) Prior Publication Data

US 2006/0041803 A1 Feb. 23, 2006

Related U.S. Application Data

(60) Provisional application No. 60/565,308, filed on Apr. 26, 2004.

(51) Int. Cl.
*G01R 31/3177* (2006.01)
*G01R 31/40* (2006.01)

(52) U.S. Cl. ............. 714/724; 714/37; 714/39
(58) Field of Classification Search .............. 714/724, 714/46, 45, 42, 39, 37, 25
See application file for complete search history.

(56) References Cited

U.S. PATENT DOCUMENTS

| | | | |
|---|---|---|---|
| 6,279,077 B1* | 8/2001 | Nasserbakht et al. | 711/118 |
| 6,389,379 B1* | 5/2002 | Lin et al. | 703/14 |
| 6,466,511 B2* | 10/2002 | Fujita et al. | 365/233 |
| 6,490,727 B1* | 12/2002 | Nazarathy et al. | 725/129 |
| 6,760,898 B1* | 7/2004 | Sanchez et al. | 716/16 |
| 6,768,338 B1* | 7/2004 | Young et al. | 326/44 |
| 6,996,758 B1* | 2/2006 | Herron et al. | 714/726 |
| 7,150,002 B1* | 12/2006 | Anderson et al. | 717/107 |
| 7,367,028 B2 | 4/2008 | Kodosky et al. | |
| 2003/0018929 A1* | 1/2003 | Bardsley et al. | 714/39 |
| 2005/0166110 A1* | 7/2005 | Swanson et al. | 714/728 |

* cited by examiner

*Primary Examiner*—Cynthia Britt
*Assistant Examiner*—Dipakkumar Gandhi

(57) ABSTRACT

A dynamic probe system for probing a FPGA with at least one core. A trace core is added to the FPGA, the trace core in communication with a plurality of signal banks, each signal bank comprising a plurality of signals in the at least one core. A logic analyzer, in communication with the trace core and selecting the bank of signal to be sent from the trace core to the logic analyzer.

27 Claims, 10 Drawing Sheets

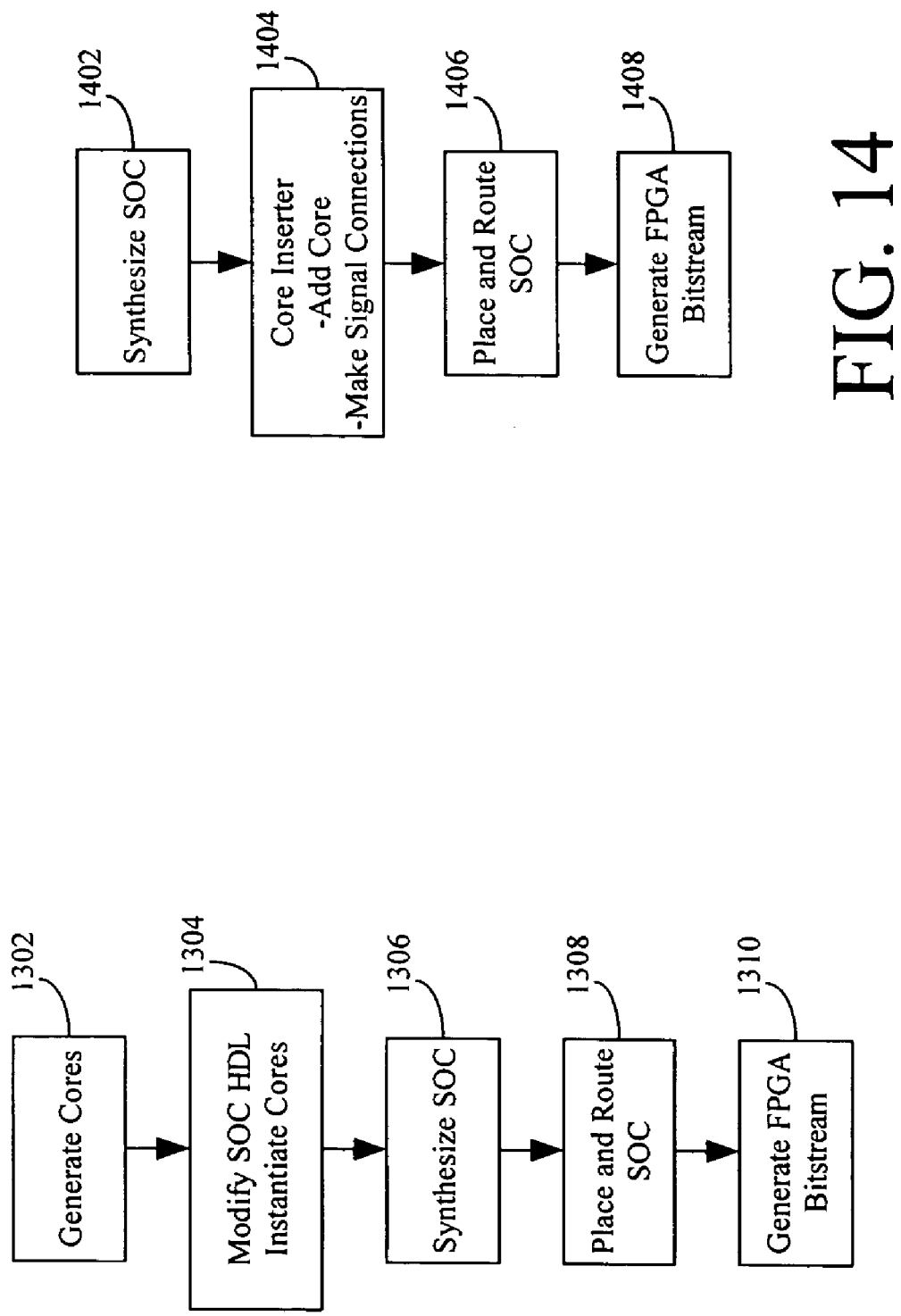

APPARATUS AND METHOD FOR DYNAMIC IN-CIRCUIT PROBING OF FIELD PROGRAMMABLE GATE ARRAYS

BACKGROUND OF THE INVENTION

A system on a chip, SOC, is designed using high level design units. These units, also known as cores or macros, are created in-house or purchased from a third party. Examples of cores include: embedded processors; busses; memory; external IO; and custom logic. The ideal in-house core is one that is complete and fully verified prior to using it in an SOC. If the core is not available, a third party core is sought. The third party core is a highly specialized intellectual property core that ideally plugs into the SOC design. If all the cores are functionally correct and they work well with each other, then the process of creating SOCs simply involves connecting cores together. However the reality is that this is usually not the case and most designs require extensive in-circuit testing.

When doing in-circuit testing, the desired goal is to feed the chip with real world stimuli throughout the operating range; this type of testing is commonly called shmoo testing. It is through shmoo testing that complete confidence in the SOC design is obtained. SOC's are typically tested by manufacturing a prototype printed circuit board, PCB, containing the SOC design. Often, the prototype PCB design employs a field programmable gate array (FPGA) in place of an ASIC. FPGAs are used for the re-programmability, which lends itself well to a test and repair loop often iterated during chip turn on.

FPGAs are extremely useful integrated circuits (ICs) employed by electronics designers in a multitude of industrial and consumer electronic products to implement a considerable amount of digital circuitry within a small area. The use of these circuits normally provides fast, reliable, compact functionality to any device in which they reside. The designer typically defines the integrated circuitry using a programming language, and then employs readily available software to compile the circuit definition into a form of data used to program an FPGA with the functions specified by the designer.

Bench top instruments, like oscilloscopes and logic analyzers, are important tools used during in-circuit test. Many digital designers are accustomed to bringing up their prototype boards using a logic analyzer as a debug aid. They use the logic analyzer to help uncover integration issues as well as design errors. To observe the behavior of the system, the designer probes various buses and chips in an attempt isolate the root cause of the problem. It is through this probing and re-probing of various components, that enough information may be gathered to properly assess the factors leading to the problem. With this information it is possible for the engineering team to understand the error and formulate a solution.

From a testing perspective, most FPGAs have a limited number of power, input, and output pins, especially when compared to the amount of signals that exist within an FPGA. This limits the external visibility of most of the signals to electronic test and measurement equipment. In most cases, the designer can view only a few internal signals of interest that are connected to a limited number of dedicated debug pins on the FPGA package. To analyze another group of signals, the circuit definition must be modified to disconnect the previously viewed signals from the debug pins and new signals of interest rerouted to those pins. The new circuit definition must then be recompiled and the FPGA re-programmed. Every time a new set of signals is to be probed, the foregoing process is repeated. As a result, debugging a design can become a painstaking, time-consuming, and error-prone process.

Additionally, each design compilation has the potential of subtly altering the timing characteristics of the FPGA because of changes in signal routing and capacitive loading. The mere process of recompiling the FPGA, even with seemingly minor changes, has the potential to inject non-deterministic timing issues that could cause the design to operate incorrectly, thus requiring further design changes and recompilation.

The present inventors have recognized a need for circuits and methods that provides an FPGA designer with a flexible approach to analyzing the internal signals of a FPGA and in particular FPGA used with SOC designs.

BRIEF DESCRIPTION OF THE DRAWINGS

An understanding of the present invention can be gained from the following detailed description of the invention, taken in conjunction with the accompanying drawings of which:

FIG. 13 is a flow chart of a method in accordance with an embodiment of the present invention.

FIG. 14 is a flow chart of a method in accordance with an embodiment of the present invention.

DETAILED DESCRIPTION

Figure 1:
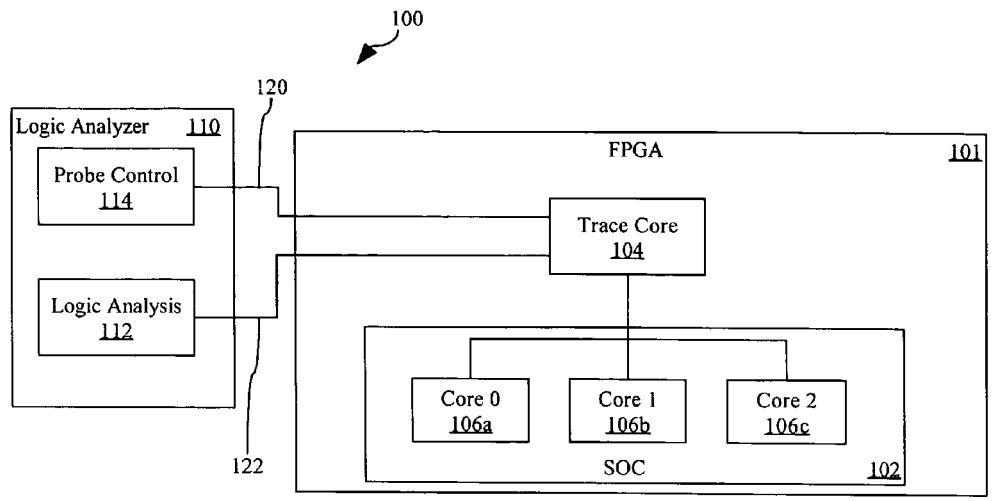
FIG. 1 is a block diagram of a dynamic probe in accordance with an embodiment of the present invention.

Reference will now be made in detail to the present invention, examples of which are illustrated in the accompanying drawings, wherein like reference numerals refer to like elements throughout. The detailed description which follows presents methods that may be embodied by routines and symbolic representations of operations of data bits within a computer readable medium, associated processors, logic analyzers, digital storage oscilloscopes, general purpose personal computers configured with data acquisition cards and the like. A routine is here, and generally, conceived to be a sequence of steps or actions leading to a desired result, and as such, encompasses such terms of art as "program," "objects," "functions," "subroutines," and "procedures." These descriptions and representations are the means used by those skilled in the art effectively convey the substance of their work to others skilled in the art.

The apparatus and methods of the present invention will be described with respect to implementation on a logic analyzer, but the methods recited herein may operate on a general purpose computer or other network device selectively activated or reconfigured by a routine stored in the computer and interface with the necessary signal processing capabilities. More to the point, the methods presented herein are not inherently related to any particular device, rather, various devices may be used with routines in accordance with the teachings herein. Machines that may perform the functions of the present invention include those manufactured by such companies as AGILENT TECHNOLOGIES, INC., HEWLETT PACKARD, and TEKTRONIX, INC. as well as other manufacturers of test and measurement equipment.

With respect to the software described herein, those of ordinary skill in the art will recognize that there exist a variety of platforms and languages for creating software for performing the procedures outlined herein. The embodiments of the present invention can be implemented using any of a number of varieties of C, however, those of ordinary skill in the art also recognize that the choice of the exact platform and language is often dictated by the specifics of the actual system constructed, such that what may work for one type of system may not be efficient on another system.

General Structure

FIG. 1 is a block diagram of a dynamic probe system 100 in accordance with an embodiment of the present invention. The dynamic probe system 100, simplifies debugging on, for example, FPGAs and Systems on a Chip (SOCs). The dynamic probe system 100 improves observability facilitating in-circuit debug. While the dynamic probe system 100 is designed for the SOC flow (allowing all existing tools, design procedures, and HDL for the SOC is to be kept in tact) the present invention is not limited to SOCs but may be used in a variety of environments both on and off FPGAs.

The dynamic probe system 100 generally comprises a logic analyzer 110 connected to one or more trace cores 104 inside a FPGA 101. The trace core 104 comprises a dedicated debug core that routes internal signals off the FPGA 101 to the logic analyzer 110. The trace core 104 connects internal signals from one or more cores 106n in the SOC 102 (or more generally the circuit under test) to output pins probed by a logic analyzer 110. The logic analyzer 110 and the FPGA 101 are connected by two busses 120 and 122.

Data signals from the cores 106n are obtained off spare pins on the FPGA 101 over a data signal bus 122. The data signal bus 122 typically, but not necessarily, comprises a regular probing connection associated with the logic analyzer 110. As the number of spare pins is usually are fewer than the number of signals that need probing, the trace core 104 switches the signal output on the pins to provide selectable banks of signals. The term signal and channel are used interchangeably herein.

The logic analyzer 110 generally comprises a logic analysis portion 112 and a probe control portion 114. The logic analyzer 110 can be based on, for example, an AGILENT 16903A. The logic analysis portion 112 generally comprises a known logic analyzer while the probe control portion 114 generally comprises additional software running under the operating system attendant to the logic analysis portion 112. The probe control portion 114 generally monitors and controls the trace core 104 using a serial communication bus 120 operating in accordance with any of a number of serial communication standards, such as IEEE 1149.1—also known as JTAG. Benefits of JTAG include a low bandwidth, ready availability and easy integration with FPGA fabric.

The dynamic probe system 100 can be configured for state or timing measurements. State measurements use a single sampling clock for all the inputs to the trace core. The sampling clock for the state core comes from within the SOC 102. Timing measurements do not use a design supplied sampling clock. Instead the trace data is sampled on the logic analyzer 110 using a clock generated by the logic analyzer 110. Thus, with a trace core 104 configured for timing measurements (a "timing trace core") it is possible to inspect glitches in the SOC 102, whereas a trace core 104 configured for state measurements (a "state trace core") is intended for synchronous measurements.

Figure 2:
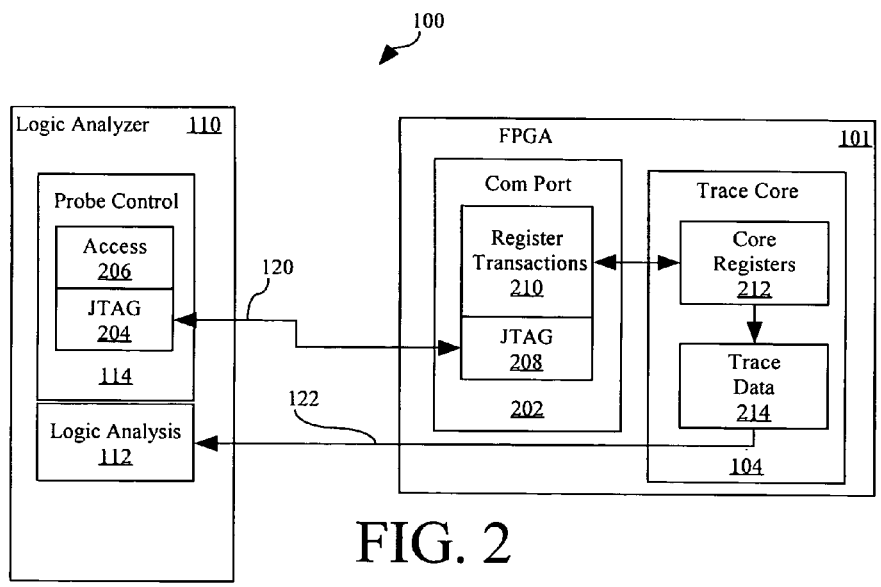
FIG. 2 is a block diagram of a dynamic probe in accordance with an embodiment of the present invention.

FIG. 2 is a block diagram of a dynamic probe 100 in accordance with an embodiment of the present invention. A trace core logic analyzer communication port 202 acts as a bridge between the logic analyzer 110 and the trace core 104. JTAG controllers 204 and 208 in the logic analyzer 110 and FPGA 101, respectively, facilitate communication over a serial bus 120. Access controller software 206 associated with the probe control portion 114 generates JTAG transactions to access the core registers 212 in the trace core 104. The communication port 202 converts the JTAG transactions into register transactions 210. The register transactions 210 are used to update the bits in core register 212. Using JTAG over the serial bus 120, the logic analyzer 110 can read and write information to the core registers 212. The core registers 212 may be used to store status information and instruction regarding the operation of the trace core 212. Based on the instructions contained in the core registers 212, the trace core 104 outputs trace data 214 to the logic analysis unit 112.

State Trace Core

Figure 3:
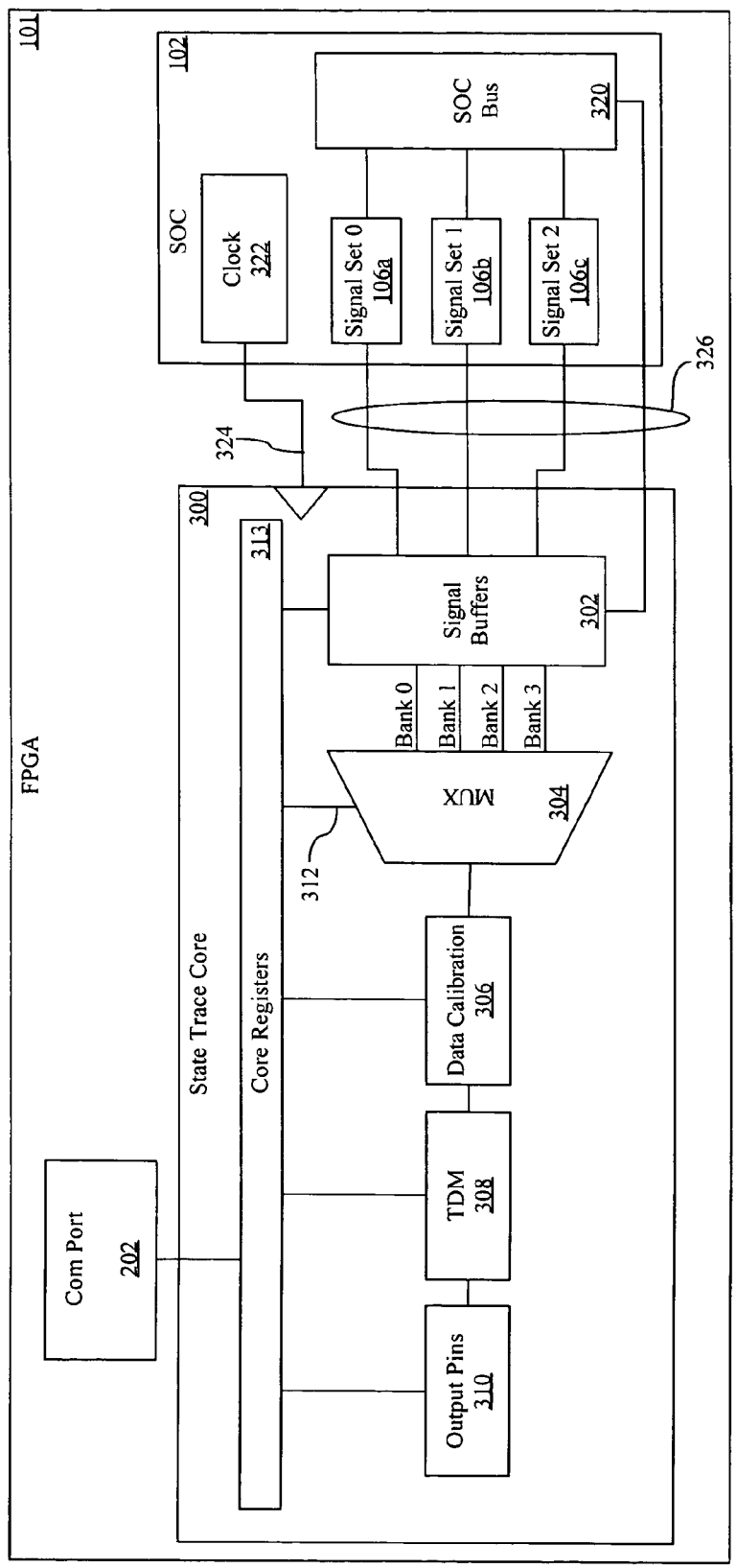
FIG. 3 is a block diagram of a state trace core, for use in a dynamic probe, in accordance with an embodiment of the present invention.

FIG. 3 is a block diagram of a state trace core 300 (also referred to as the core 300), for use in a dynamic probe 100, in accordance with an embodiment of the present invention. The core 300 generally comprises a multiplexer (mux) 304, a data calibration unit 306, a time division multiplexer (TDM) 308, output pins 310, along with a set of status and control registers collectively referred to as the core registers 313. The core registers 313 provide supervisory access to the logic analyzer 110. The mux 304, data calibration unit 306, TDM 308 and output pins 310 provide the physical link between probed signals on the SOC 102 and output pins going to the logic analyzer 110 (see FIG. 1). The physical link is synchronized to a sampling clock 322 supplied by the SOC 102 via channel 324.

A buffer 302 is situated between the mux 304 and the SOC 102. The buffer 302 generally comprises registers spanning the mux 304's inputs. The buffer 302 isolates the core 300 from the SOC 102. This isolation has two benefits. First, the mux 304 is not directly connected to the probed signal. The registers in the buffer 302 act as pipeline registers, adding only one additional load to the SOC signal and hiding any mux delay from it. The second benefit is that the registers in the buffer 302 can be disabled blocking signals from passing through to the rest of the core 300. The advantage here is that the core 300 can be turned off to save power, by simply disabling the buffer 302.

The mux 304 generally comprises a parallel multiplexer that directs groups, or banks, of signals from banks of inputs to a single bank of outputs. The number of input banks is configurable, and can be set to any desired size, for example from 2 banks to 2048 banks. With each additional bank, the number of observable signals increases. Each bank is connected to a signal set 106n in the SOC 102. Each signal in a set may be obtained from anywhere within the SOC 102, including a SOC bus 320. In FIG. 3, each line in the data signal connections 326 represents a bank of signals (or channels), e.g. a plurality of physical signal lines, for example 32 separate data sources. The number of signals in each signal set 106n may be defined by the designer, but (absent the use of TDM 308) generally corresponds to the number of output pins 310 dedicated for debugging.

The output of the mux 304 is switched using one or more select lines 312. Select lines 312 are driven by entries, set by the logic analyzer 110, in the core registers 313. The number of select lines 312 is dependent on the number of banks applied to the mux 304. For example if there are four banks (as shown in FIG. 3) then two select lines 312 would suffice. If eight banks are used then three select lines 312 would be needed.

The output of the mux 304 may be registered (not shown) to pipeline the mux logic and increase the performance of the core 300. The primary benefit is that the core 300 will not only run faster, but is less likely to interfere with the overall SOC timing budget.

At the end of the physical signal link between the SOC 102 and the core 300 are output pins 310. The output pins 310 generally comprise FPGA output buffers and pins/balls. It is to the output pins that the logic analyzer 110 will physically connect via the data channels 122. When the core 300 is created, the user specifies sets the number of data channels going to the logic analyzer 110—usually based on the available debug/spare pins in the FPGA 101. The core 300 has two types of channels going to the logic analyzer 110. The first channel type is a clock channel used to carry the clock signal from the clock 322 for use in sampling the trace data 214. The clock 322 generally comprises the trace core sample clock provided by the SOC 102. Typically only one pin is required for the clock channel 324. The second channel type is a data signal channel that carries the probed signals from the SOC 102 to the logic analyzer 110.

Figure 4:
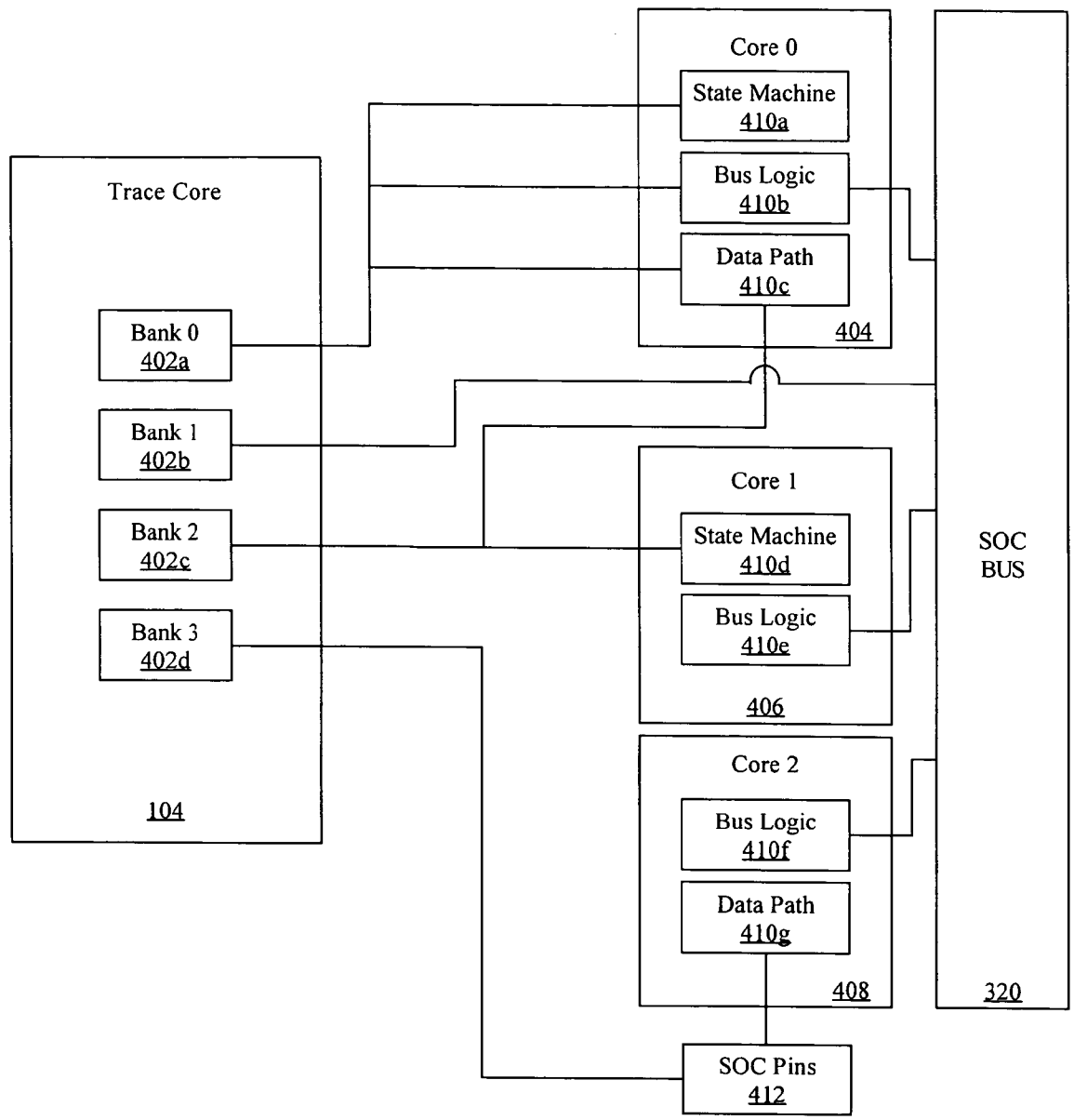
FIG. 4 is a block diagram useful for explaining input connections in a dynamic probe in accordance with an embodiment of the present invention.

FIG. 4 is a block diagram of input connections, for use in a dynamic probe 100, in accordance with an embodiment of the present invention. The signals within each signal set, e.g. bank 402n) can originate from anywhere inside the SOC 102. FIG. 4 illustrates several examples of possible signal sources in the SOC 102. For example, signals can come from the periphery as well as the logic inside of a SOC 102 encompassing such sources as cores, busses (for example an SOC bus 320) or input pins. The connections to an individual input bank 402n may span across cores 404-408 and pins 412 as shown in FIG. 4. Signals obtained from the cores 404-408 may come from any functional block 410n within such cores such as state machines 410a and 410d; bus logic units 410b, 410e, and 410f; and data paths 410c and 410g.

Data Calibration Unit

Figure 5:
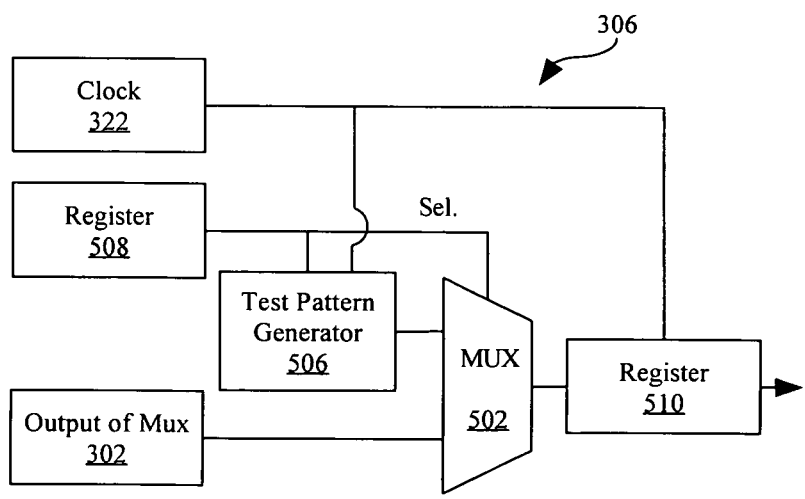
FIG. 5 is a block diagram of a calibration unit, for use in a dynamic probe, in accordance with an embodiment of the present invention.

FIG. 5 is a block diagram of a calibration unit 306, for use in a dynamic probe 100, in accordance with an embodiment of the present invention. Logic analyzers, such as the logic analyzer 110, typically contain circuitry to deskew state data. Such circuitry usually samples each input channel to find the best sampling position. To get the best position, test data toggled at every clock may be sent to the logic analyzer 110 for deskewing. The calibration unit 306 creates a toggling 1-0 pattern on every channel so that the logic analyzer 110 can properly deskew the input channels.

The calibration unit 306 generally comprises a multiplexer 502 (mux 502), a register 510, and a test pattern generator 506. The mux 502 is a parallel mux with two bank inputs. Bank 0 receives the output of the mux 304 (see FIG. 3) and bank 1 receives calibration data from the test pattern generator 506. A selection line, set by a register 508 in the core registers 313, switches the output of the mux 502. By way of example, when the register 508 is set data from bank 1 of the test mux 502 passes through. When the register 508 is disabled, the data signals from the mux bank output 404 are passed through. The output of the mux 502 may be registered, by register 510, to improve core timing. The register 510 is responsive to the clock signal 322 and acts as a pipeline register.

The calibration data generator 506 is a pattern generator that outputs, for example, a 5a-a5 pattern for logic analyzer data deskew. The 5a-5a pattern toggles every data output on every clock and forces adjacent outputs to have opposite polarity. When one bit goes from "0" to "1" the adjacent bit goes from "1" to "0." With this pattern cross talk effects can be factored out so that the logic analyzer sample position is at the steady, or quiet, state of the data transition. Simultaneous switching output effects are also handled by this pattern because it toggles each output at every clock. Half of the outputs will go from 1 to 0 and the other half will go from a 0 to a 1.

The calibration data generator has two forms. Both provide a 5A pattern to the logic analyzer, however the two have distinct designs. This uniqueness is linked to presence or absence of the TDM 308. The TDM 308 accelerates data off chip and can equate to doubling the number of signals sent off the SOC 102. The TDM 308 works by multiplexing a plurality of signals (for example two) in time. Using two signals as an example, the first signal is sent on the rising edge of the source clock to the output pin. On the falling edge the second signal is sent to the output pin. Therefore with TDM 308 every output pin passes twice the amount of data. This benefit may come at the cost of signal integrity. Because the TDM 308 doubles the off chip data rate, the outputs may begin to have problems sending reliable data to the logic analyzer 110. With respect to the test pattern generator 506, the presence of the TDM 308 affects the timing of the test pattern.

Figure 6:
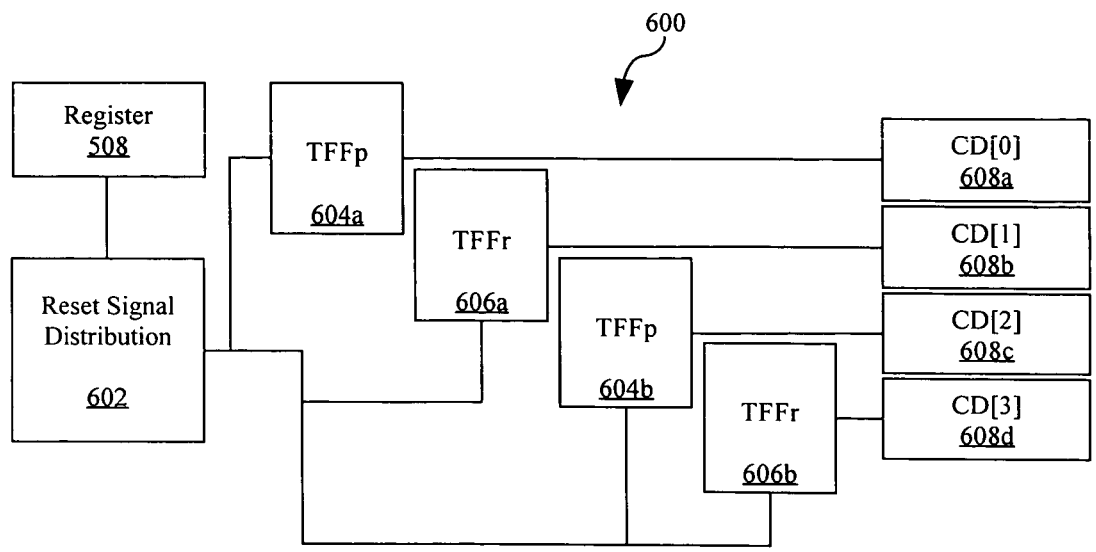
FIG. 6 is a block diagram of a test pattern generator, for use in a dynamic probe, in accordance with an embodiment of the present invention.

FIG. 6 is a block diagram of a test pattern generator 600, for use in a dynamic probe, in accordance with an embodiment of the present invention. More specifically the test pattern generator 600 is useful when the state trace core 300 lacks the TDM 308. The test pattern generator 600 generally comprises a series of T-flip flops 604n and 606n, one for each output pin 608n. In the example shown in FIG. 6, four pins 608a through 608d are illustrated. The T-flip-flops 604n and 606n generate the toggling pattern so that the output toggles on every clock period. T-flip-flops 604a and 604b are preset T-flip flops that are set to a 1 when the preset signal is asserted. T-flip-flops 606a and 606b are reset T-flip flops, that are reset to a 0 when the reset signal is asserted. Using this combination of T-flip flops the outputs are initialized with a 1-0 pattern. In other words, when one trace pin 608n will have a 1, the adjacent pin 608n±1 will have a 0, followed by a 1, and a 0, continuing in succession with this pattern until the full width is filled. Thus, the first pattern has a 1 or 0 on every pin 608n and it then toggles on every clock period to produce simultaneously switching outputs.

The register 508 initializes all the T-flip flops 604n and 606n to a 1 or a 0. The output of the register 508 drives the synchronous reset/preset line to the T flip-flops 604n and 606n. The output of the register 508 is fanned out, by a reset signal distribution unit 602 to the T-flip flops 604n and 606n. The signal may be buffered in the reset signal distribution unit 602 using additional flip-flops. The latency incurred by the additional flip-flops is tolerable and the additional space required is a compromise so that the overall performance of the core is maintained. If the reset on the T-flip flops is not released at the same time, some of the outputs may have the wrong pattern, for example a 1-1 pattern. An error such as this will defeat the purpose of the calibration and may cause bad data to be captured by the logic analyzer 110.

Figure 7:
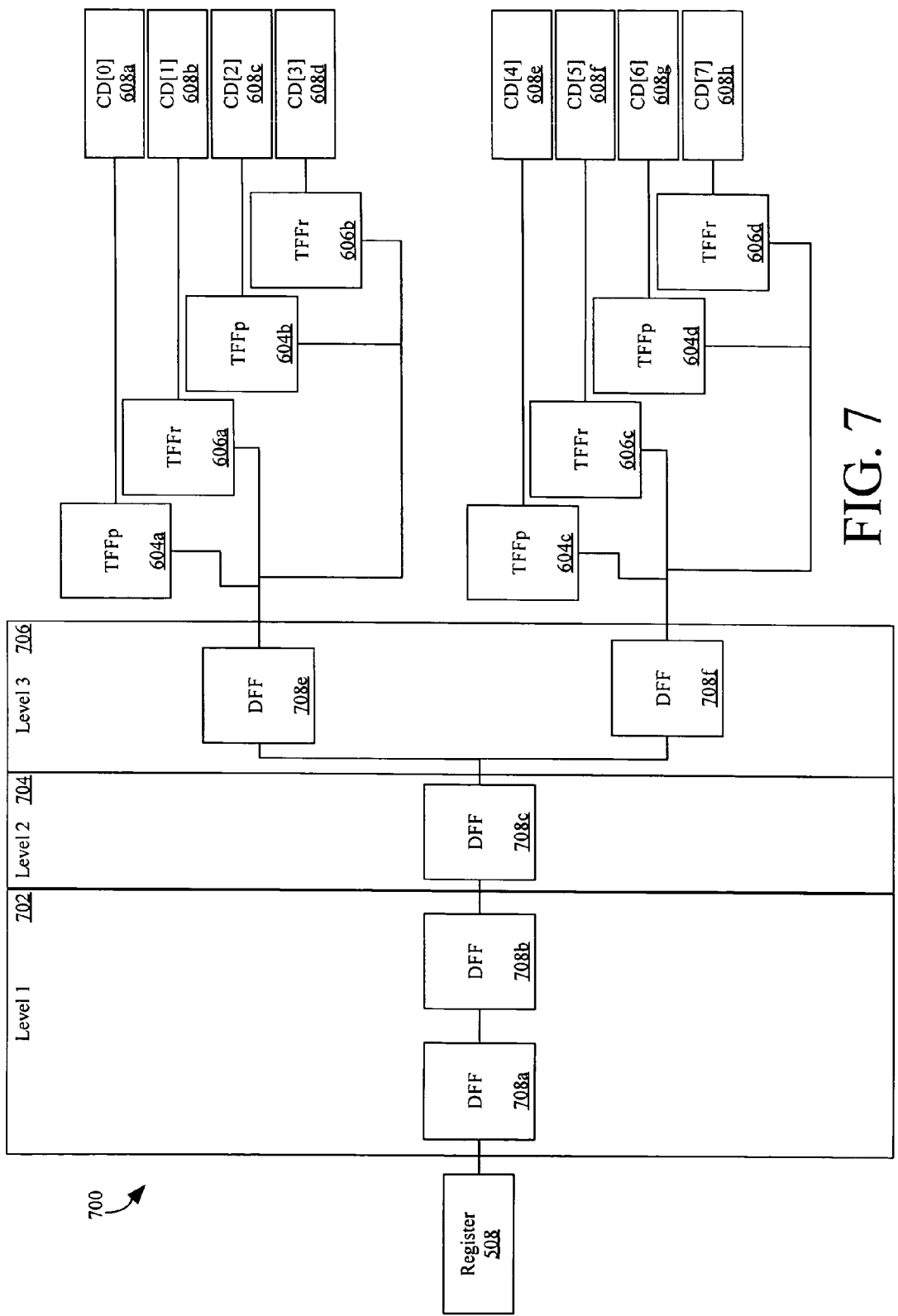
FIG. 7 is a block diagram of a reset buffering tree, for use in a dynamic probe, in accordance with an embodiment of the present invention.

FIG. 7 is a block diagram of a reset buffering tree 700, for use in the reset signal distribution unit 702, in accordance with an embodiment of the present invention. FIG. 7 illustrates a reset buffering tree 700 suitable for use with an eight pin wide bank. The output of the register 508 is buffered through a series of flops 708n. It may prove beneficial to limit the max fanout of the buffered reset signals to eight signals per buffered reset. The buffering is done by cascading flops 708n in a tree like structure. In the first level 702 of the tree there are two flops 708a and 708b. The first flop 708a samples the register 508 and sends it to the second flop 708b. The purpose of the second flop 708b is to reduce meta-stability by registering the output of the register 508. The output of the second flop 708b is fanned out to as many as four flops in level 2 704 (one flop 1208c being shown). Each flop of Level 2 704 is fanned out to as many as eight flops of level 3 706 (two being shown 708c and 708d). Finally, the flops at level 3 706 are fanned out to the reset/preset inputs of up to four calibration data generator T-flip flops 604n and 606n whose functions are described hereinabove.

If the TDM 308 is not added to the trace core 300, each channel in the calibration output is registered using a single flop. This flop, which may be embedded into the IO block of the FPGA, is used so that the time to clocked output, TCO, is reduced and the trace data-to-data skew is also minimized. Again, this additional flop does not deplete the FPGA fabric flop count.

Figure 8:
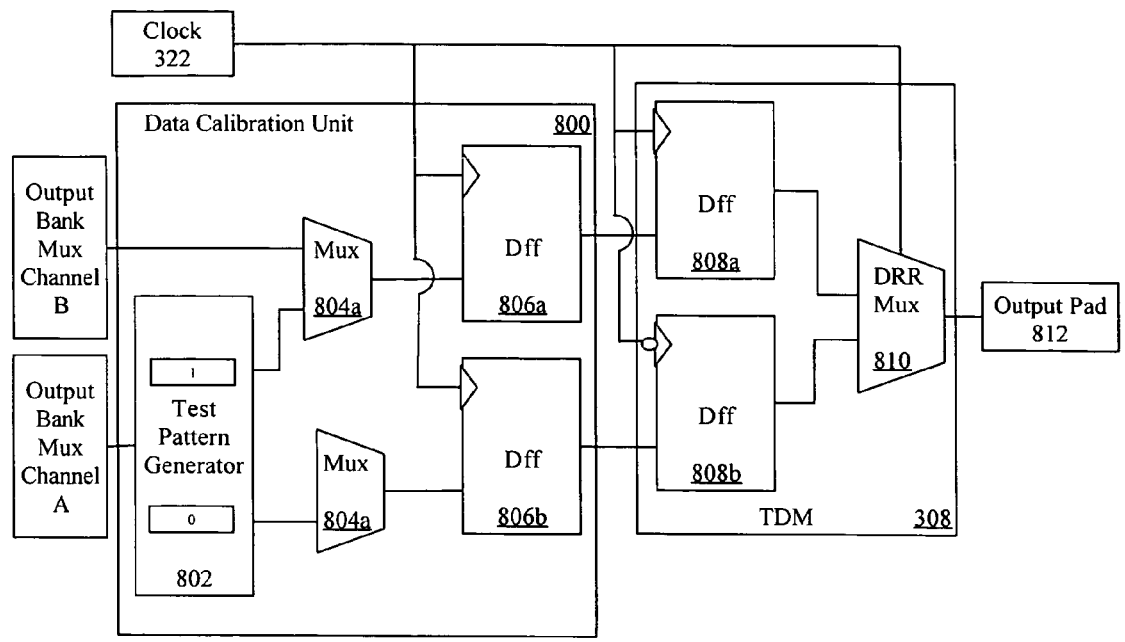
FIG. 8 is a block diagram of a data calibration unit and a time division multiplexing unit, for use in a dynamic probe, in accordance with an embodiment of the present invention.

FIG. 8 is a block diagram of a data calibration unit 800 and a TDM 308, for use in a dynamic probe, in accordance with an embodiment of the present invention. When the TDM 308 is implemented, the data calibration unit 800 is simplified to output a fixed pattern. A test pattern generator 802 toggles the outputs at a rate based on the compression of the TDM 308. The TDM 308 has double data rate flops that accelerate twice the data with half the pins. Therefore, it is possible to toggle the pin data using a fixed pattern. The only care here is that the second pattern should complement the first pattern, in other words a 1 followed by a 0. This is accomplished by taking half of the TDM width and setting a 1-0 pattern while complementing the second pattern. The advantage of using a fixed pattern is that no special reset tree is needed and no additional T-flip-flop resources are required, only pull-up/pull-down resources are used. Therefore, when the TDM option is enabled, the test pattern generator 802 uses LUTs and FLOPs only for the core calibration MUX.

The output of the test pattern generator 802 is supplied to multiplexers 806a and 806b. One multiplexer 804n is provided for each output channel of the bank mux 304. Two channels A and B are shown in the example illustrated in FIG. 8. The output of each mux 804n, along with a clock signal 322, is supplied to flops 806a and 806b. The output of the flops 806a and 806b, along with the clock signal 322 are supplied to the TDM 308.

Time Division Multipleking Unit

Figure 9:
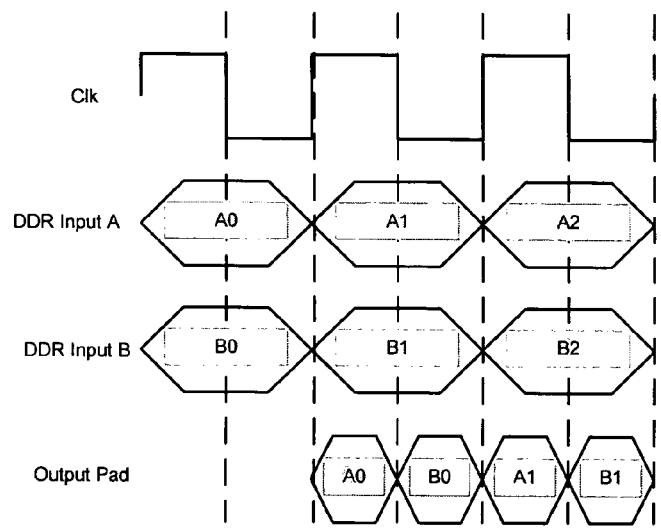
FIG. 9 is a waveform diagram of the time division multiplexing unit shown in FIG. 9.

FIG. 9 is a waveform diagram of a TDM unit 308, for use in a dynamic probe, in accordance with an embodiment of the present invention. The TDM 308 is used to increase the bandwidth of the trace pins. The TDM 308 accelerates internal data so that twice the amount of data can be seen with the same number of pins. This has the effect of doubling the mux bank input width. For example if 8 trace pins are reserved for the trace core 300, the TDM 308 will allow seeing 16 signals per input of the mux bank 304.

The TDM 308 uses a special double data rate registers preferably, but not necessarily, located in the IO block of the FPGA to accelerate the data. Using the example shown in FIG. 8 that illustrates two channels, the double data rate registers is composed of two flops 808a and 808b and a high speed DDR multiplexer 810. One of the flops, for example 808a, samples the data on the rising edge while the other flop, for example 808b, samples on the falling edge. The output of the flops 808a and 808b are supplied to a high speed mux 810 that uses the clock 322 as the select control. When the clock is 1 the rising edge data is sent off chip, when the clock is 0 the falling edge data is sent to an output pad 812.

Timing Trace Core

Figure 10:
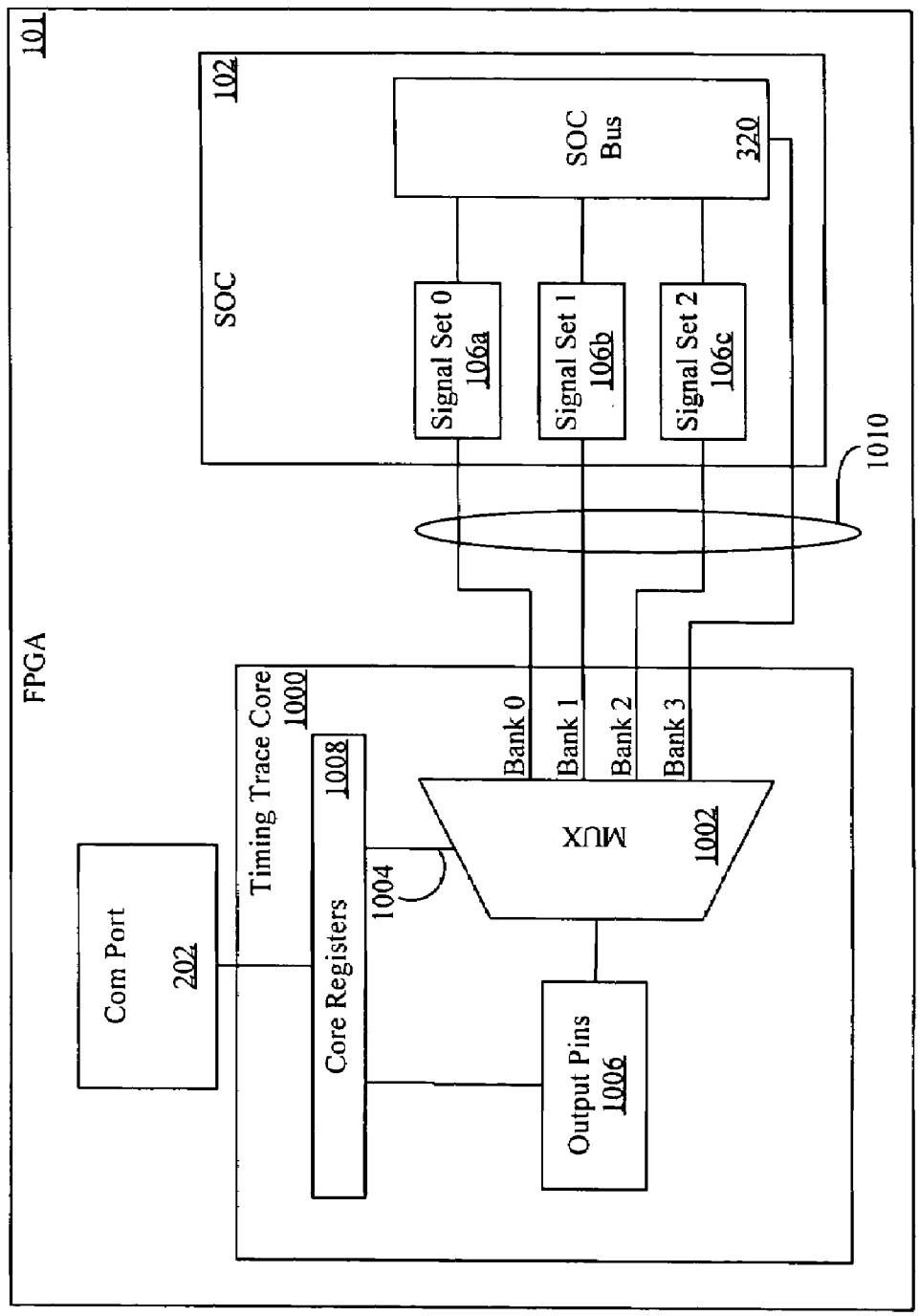
FIG. 10 is a block diagram of a timing trace core, for use in a dynamic probe, in accordance with an embodiment of the present invention.

FIG. 10 is a block diagram of a timing trace core 1000 (also referred to as the core 1000), for use in a dynamic probe, in accordance with an embodiment of the present invention. The timing trace core generally comprises a multiplexer 1002 (mux 1002), output pins 1006, and core registers 1008. The mux 1002 and the output pins 1006 provide the physical link between internal signals and output pins. The physical link is asynchronous inside the core 1000 and does not require a sampling clock from the SOC 102. Data on the physical link is captured by the logic analyzer 110 (see FIG. 1) using the logic analyzer's high speed sample clock. The registers 1008 serve as the supervisory access for the logic analyzer 110.

The timing core mux 1002 is similar to the state core mux 304 with the exclusion of the optional input and output registers. The timing core mux 1002 directs banks of inputs to an output but does not register the inputs or the outputs allowing data going through the mux to be truly asynchronous. The number of mux input banks may range, for example, from 2 to 1024 and is set when the core 1000 is created. In FIG. 10, each line in the data signal connections 1010 represents a bank of signals, e.g. a plurality of physical signal lines (or channels), for example 32 separate data sources. The mux outputs are switched using select lines 1004 connected to the registers 1008. The inputs 1002 to the mux 1004 can come from anywhere inside the FPGA 101, allowing for a flexible connection of any signal in the SOC 102 to the timing trace core 1000.

The output of the mux 1002 goes to output pins 1006. These pins represent the output buffers and pin/balls that connect to the logic analyzer 110. When the core 1000 is created, the user specifies the number of pins, pin location, and output buffer standard for the core 1000 outputs. The core 1000 only has data signal channels as the clock channel from the SOC 102 is not used; however, the clock signal may be sent as a data signal. In general, the number of pins used by the core 1000 is always equal to the number of data signal channels.

The path between the probed SOC signals and the output pins 1006 is an unconstrained, false, path. This path is unconstrained in the FPGA 101 because the path from the probed SOC signal to the output pins 1006 has no registers. Since no registers exist, FPGA place and route tools are unaware of any timing constraints. Therefore the FPGA tools will treat this as an unconstrained, false path. The effect of this behavior is that the timing of the probed signals will not affect the timing budget of the SOC 101.

The one draw back to the use of an unconstrained path is that the timing trace core data will be skewed. In this case, the deskew feature of the logic analyzer 110 can not be used. The solution to this is to either add constraints for the paths or to create an FPGA timing report and normalize the data captured by the logic analyzer 110. Resources are readily available for those of ordinary skill in the art to implement either solution.

The timing trace core 1000 does not have a data calibration or TDM unit. With respect to the data calibration unit, the data may be manually deskewed (normalized) by the user using the logic analyzer over samples the inputs. TDM is not possible because the core 1000 lacks an SOC sample clock from which to ship data a on its rising and falling edge. However, omitting these units reduces the size of the core 1000.

The timing trace core 1000 is intended to aid in measuring asynchronous events at a grand scale. The core 1000 is not intended to aid in finding the precise setup and hold window of an individual flip-flop inside the FPGA 101. Instead, it is intended to aid in finding signals that toggle too early or late relative to other signals. The core 1000 can also be used to detect glitches at the input pins, which may indicate problems at the PCB. The core 1000 can aid in determining how long a signal remains high or low and at what rate it toggles. Finally, the core 1000 can be used in multi-clock domain debug, allowing signals from two or more clock domains to be inspected simultaneously by the logic analyzer 110.

Communication

Referring once again to FIG. 2, the logic analyzer 110 is electrically connected to the FPGA 101 using two types of connections. Connection 120 preferably comprises a JTAG connection implemented with a FPGA programming cable. The connection 120 may be implemented using an FPGA parallel or USB programming cable. This programming cable is simply the standard programming hardware available from a variety of FPGA vendors. The other type of connection is at the output pins, for example pins 310 in FIG. 3. The output pins connect to the inputs of the logic analyzer 110 acquisition hardware.

Software in the logic analyzer 110 controls acquisition channels and communication with the trace core 104. Such software may comprise a graphical user interface (GUI) that displays traces captured and facilitates measurements. The GUI may facilitate setting up the logic analyzer 110 and displaying results. Additional software automates the connection and control of the trace core 104.

The physical link between the logic analyzer 110 and the FPGA 102 is used to initialize the trace core 104 and set up the logic analyzer 110 for a measurement. The connection 120 enables control of the trace core 104 and programming of the FPGA 101. FPGA programming may be performed through special JTAG in-circuit programming embedded in the FPGA 101. The details of such circuits are known to those of ordinary skill in the art and will not be repeated herein. When the FPGA 101 is programmed with an SOC design that has one or more trace cores 104 software on the logic analyzer 110 may be configured to request information from the core 104 so as to automatically interrogate core parameters stored in the core registers 212. Some example of possible core parameters include the type of core, the width of the data signal channels, the number of mux banks, the presence or absence of a TDM 308, and an output driver type.

With this information a graphical model of the trace core the trace core mux (e.g. mux's 304 or 1002) can be generated. With additional information about the channels, the graphical model can present a correspondence between the logic analyzer input channels and the signals being monitored on the FPGA 101. Also, the information in the core registers 212 may be used to set the thresholds of the analyzer acquisition channels.

If the trace core 104 is a state trace core 300, the logic analyzer 110 must deskew the data inputs before taking a measurement. This is done once as part of the core initialization to ensure proper data sampling by the logic analyzer 110. Deskew may be performed using, for example an eye finder function available on many the logic analyzers, such as those form AGILENT TECHNOLOGIES. An eye finder function uses the logic analyzer acquisition hardware to determine the best sampling position per data pin by stepping through the data channel delays, taking measurements at each step. At the end of this stepping process, the eye finder function will know which regions were stable sampling regions. From this information the center position that ensures the best sampling location for each data channel may be computed.

Once the trace core 104 is configured, the logic analyzer 110 is ready to make measurements. First, the mux input signal bank 106n must be selected. When a particular bank is selected, the mux bank 106n is switched, using the JTAG communication channel 120, by setting the appropriate registers in the core registers 313. At this point, the logic analyzer 110 is ready to make a measurement on the signals in the selected mux bank 106n. When a user wants to measure a different bank, they simply select a new bank using software on the logic analyzer 110.

Communication with the trace core 104 may be facilitated using standard JTAG designs readily available for most FPGAs. Using the XILINX systems as an example, TMS, TDI, TDO, and TCK are dedicated FPGA pins that are connected to an internal JTAG TAP controller. Those of ordinary skill in the art are familiar JTAG TAP controllers. The controller is a hard macro that has the base IEEE 1149.1 instructions, such as ID and boundary scan and is provided with additional instructions for in-circuit FPGA programming. Furthermore the TAP has two special instructions, USER1 and USER2 used for fabric access through the BSCAN_VIRTEX2 library element.

BSCAN_VIRTEX2 has two ports that pass JTAG DR data into and out of the FPGA fabric. Each port is accessed with either the USER1 or USER2 instruction. When a port is selected, JTAG DR data is shifted in through the TDI pin and shifted out through the TDO pin. The BSCAN_VIRTEX2 ports can be connected in any way into the fabric. Thus with these ports it is possible to create a serial to parallel register that collects JTAG DR data that is shifted in. Similarly parallel data can be converted to serial and shifted out during a JTAG DR scan. Using this parallel to serial and serial to parallel method the core registers 313 registers may be read and written.

The BSCAN_VIRTEX2 and the parallel to serial, serial to parallel shift circuitry are contained in the Xilinx ChipScope Integrated Controller core, ICON. This core creates a debug core bus for the connection of Xilinx's ILA, IBA, VIO, and the trace core 104. The ICON core may also be used to form the communication port 202 (see FIG. 2).

The core registers 212 are divided into two classes: control and status. The control registers are typically write only registers (from the perspective of the logic analyzer 110) used to control the operation of the trace core 104. The status registers are typically read-only registers (once again—from the perspective of the logic analyzer 110) that provide core supervisory information to the logic analyzer 110. Status registers may be further divided into two types, static and dynamic.

Static status registers return physical parameters of the core. Details such as the number of banks, output voltage standard, and the number of pins may comprise part of the core static status. This static information may be implanted into the trace core 104 during core generation.

Dynamic status registers store information about the current state of the trace core 104. Examples of several dynamic registers (e.g. flags) and their description are shown in Table 1.

TABLE 1

| Flag | Description |
| --- | --- |
| ATC_EN_L_STAT | When true, indicates the core is enabled and ready to use. |
| ATC_T_EN_RDY | When true, indicates that the test data is ready to be used by the logic analyzer for channel deskew. |
| MUX_DATA_RDY | When true, indicates the data going through the mux is ready. |
| DATA_IN_SEL | Contains the current state of the selected mux bank. |

To determine when trace data is ready, the logic analyzer 110 may use dynamic registers. For instance, when the logic analyzer 110 is performing data deskew, the ATC_T_EN_RDY flag may be monitored to determine when to run eye finder.

The dynamic status registers work hand in hand with the control registers. When a control is modified, the state of the dynamic status registers typically change. Therefore every time the logic analyzer 110 makes a change to the control register, the dynamic status registers may be monitored for the appropriate response. Table 2 contains several examples of suitable entries in the core control registers.

TABLE 2

| Control | Description |
| --- | --- |
| ATC_EN_L | When true, it turns on the trace core and starts driving the trace pins. By default this is false. |
| ATC_UT_SEL | Drives the calibration mux select lines. By default user data is selected. |
| ATC_T_EN | When true, it puts the core into test mode and outputs 5A data on the trace pins. By default this is false. |
| DATA_IN_SEL | Drives the mux bank select lines. By default bank 0 is selected. |

The basic controls shown in table 2 allow the logic analyzer 110 to turn on the trace core 104 and select a user mux bank 106n. The logic analyzer 110 can also set the trace core 104 into the test mode so that calibration data is output in place of user data.

Bank Multiplexer

Figure 11:
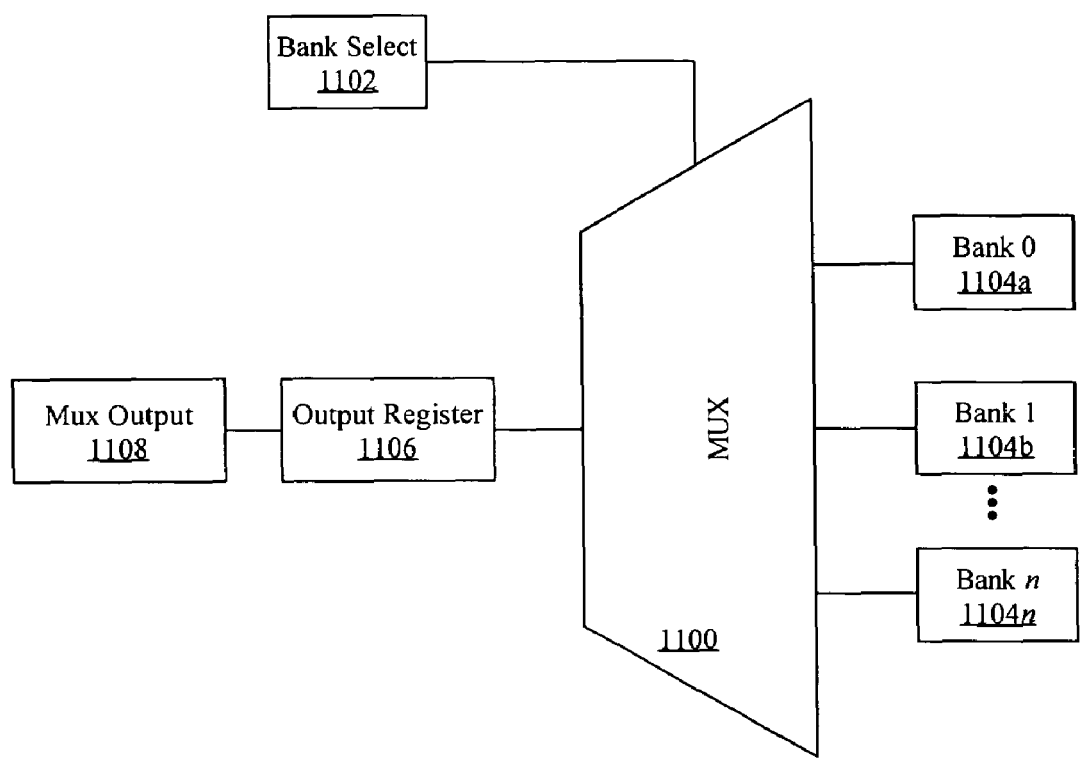
FIG. 11 is a block diagram useful for describing the operation of a bank multiplexer, in accordance with an embodiment of the present invention.

FIG. 11 is a block diagram useful for describing the operation of a bank multiplexer (mux) 1100, in accordance with an embodiment of the present invention. The configuration shown in FIG. 11 is suitable for use with a state trace core, such as the state trace core 300. The bank mux 1100 switches banks 1104n, or groups, of probed signals to an output 1108 through an output register 1106. Additional input registers (not shown) may be used to improve the clock-to-clock delay of the core through pipelining. Conversely, a timing trace core, such as the timing trace core 1000 lacks input and output registers.

The width of the inputs bank mux 1100 can vary, for example from 4 to 128 bits. Similarly the number of banks 1104n may also vary; however, it may prove useful to set the number of banks 1104n as a power of two, e.g.: 1, 2, 4, 8, 16, 32 . . . The width of the inputs along with the number of banks may be set by the user during the design phase.

The core registers 212 drive bank select lines 1102. The number of lines in the bank select line 1102 may vary based on the number of mux banks 1104n. If there is only one mux bank input 804a—no select line connections are created. If there are eight mux banks 1104a-1104h, three bits are needed in the core registers 212 and three select lines 1102 are provided.

The bank mux 1100 may be created to optimize for certain parameters. The key optimizations for the bank mux 1100 are size and propagation delay. Size has been discussed; however, equally important is the propagation delay through the bank mux 1100. Even though the inputs and outputs may be registered, mux delay can still adversely affect the design, including timing constraints such as the overall timing closure.

To meet the timing constraints, special resources in the Xilinx FPGA may be used. These special resources help minimize the propagation delay by keeping all the logic bound to a small local area, known as a SLICE. In this SLICE are lookup tables (LUTs), and additional function generators that allow the creation of large input mux structures. The propagation delays though this resource is the fastest achievable on the device and also has the added benefit of using the smallest area in the FPGA 101. In fact, the LUT consumption is one LUT for every two banks as shown in Table 3. One penalty for using this resource is that routing to the SLICE may become congested which will cause the tools to take longer to place and route the design.

TABLE 3

| Mux Banks | LUTs | Description |
| --- | --- | --- |
| 1 | 0 | No mux bank needed |
| 2 | 1 | Mux Fits into 1 LUT |
| 4 | 2 | Mux uses 2 LUTs to create one half of the mux. The outputs of these two LUTs are combined using a special function "F5" generator. |
| 8 | 4 | Mux uses 4 LUTs to create one fourth of the mux. The outputs of these 4 LUTs are combined using two special function "F5" generators connected to one "F6" generator. |
| 16 | 8 | Mux uses 8 LUTs to create one eighth of the mux. The outputs of these 8 LUTs are combined using 4 special function "F5" generators connected to two "F6" generators and one "F7" generator. |

TABLE 3-continued

| Mux Banks | LUTs | Description |
|---|---|---|
| 32 | 16 | Mux uses 16 LUTs to create one sixteenth of the mux. The outputs of these 16 LUTs are combined using 8 special function "F5" generators connected to 4 "F6" generators, two "F7 generators and one "F8" generator. |

Figure 12:
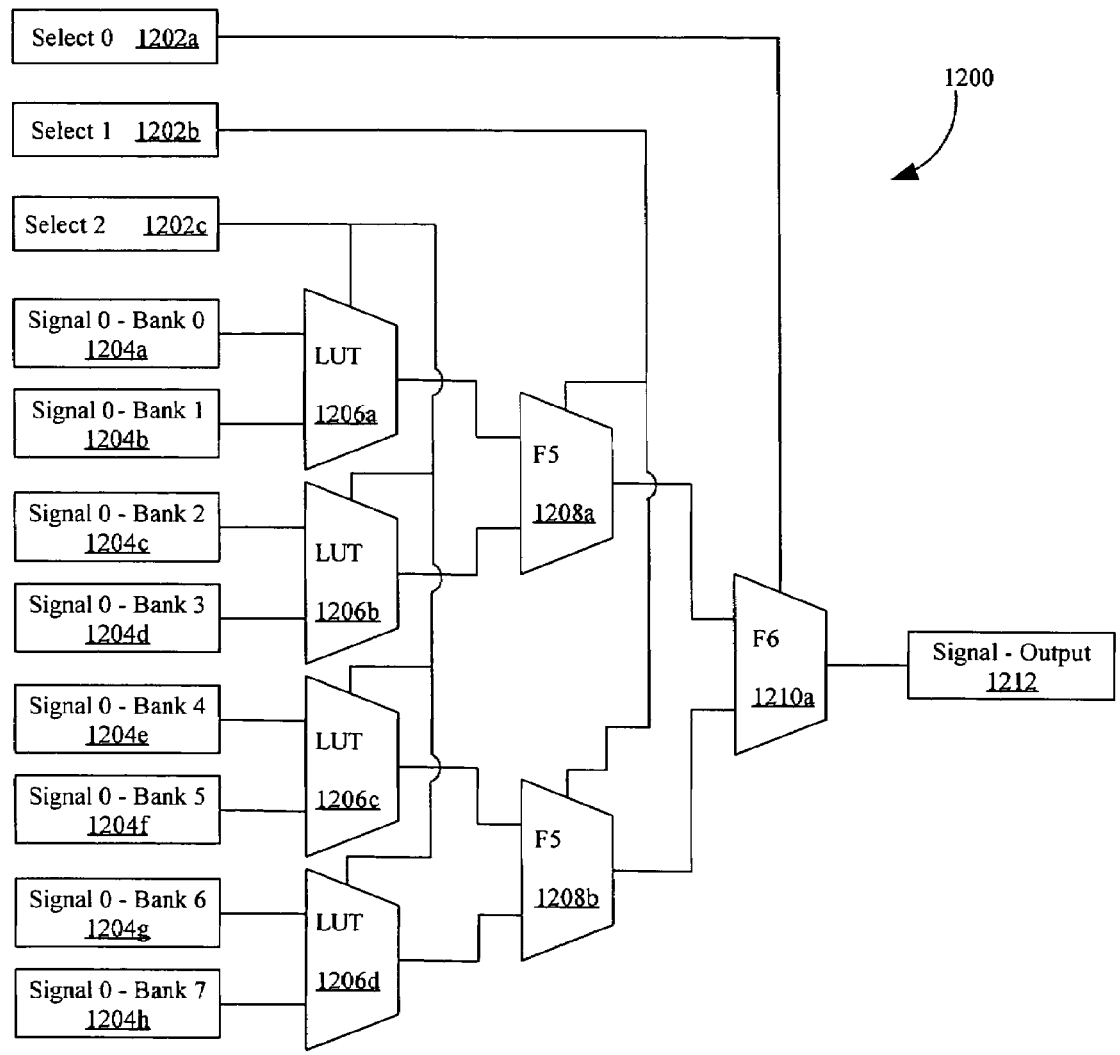
FIG. 12 is a block diagram of a portion of a bank mux, for use in a dynamic probe, in accordance with an embodiment of the present invention.

FIG. 12 is a block diagram of one channel of an eight bank mux 1200, suitable for use in a dynamic probe, in accordance with an embodiment of the present invention. A signal 0 (signals 1204a through 1204h) of each of the eight banks are presented to the mux 1200. The total number of LUTs consumed by the multiplexer 1200 per mux output bank 1212 depends on the number of banks. The mux architecture shown in FIG. 12 is based on a 2 input mux that combines with the Xilinx special FX function generators to create large muxes. In this example, one channel output 1212 for the 8 bank mux 1200 is created by using: 4 LUTs 1206a-1206d; 2 F5 generators 1208a and 1208b; and 1 F6 generator 1210a. Three select lines 1202a through 1202c are provided to control switching of the bank mux 1200. By using this architecture it keeps the LUT consumption low even for large 32 mux structures.

Output

Output pins, such as output pins 310 and 1006, are used to send trace data off chip. In the case of the state trace core 300, the TDM 308 and non-TDM flip flops may be directly connected to an output buffer inside an FPGA IO block. The timing trace core 1000 does not need to use flip flips but instead may output directly from mux bank 1002. The output pins 310 and 1006 generally comprise an output buffer and pin/ball location on the FPGA.

The output buffers on a XILINX FPGA are physically located in the IO ring. These buffers may be configured to operate in single and differential end mode. Single ended buffers use only one pin per buffer, whereas differential buffers use two pins. For single ended buffers common standards include LVTTL and HSTL. For differential ended buffers common standards include LVDS and PECL. Table 4 lists several standards that may be supported. The user specifies one of these standards for each pin during core generation.

TABLE 4

| Standard | Pins per Buffer | VCCO |
|---|---|---|
| AGP | 1 | 3.3 |
| BLVDS_25 | 2 | 2.5 |
| GTL | 1 | 3.3 |
| GTLP | 1 | 3.3 |
| HSTL_I | 1 | 1.5 |
| HSTL_I_18 | 1 | 1.8 |
| HSTL_II | 1 | 1.5 |
| HSTL_II_18 | 1 | 1.8 |
| HSTL_III | 1 | 1.5 |
| HSTL_III_18 | 1 | 1.8 |
| HSTL_IV | 1 | 1.5 |
| HSTL_IV_18 | 1 | 1.8 |
| LDT_25 | 2 | 2.5 |
| LVCMOS15 | 1 | 1.5 |
| LVCMOS18 | 1 | 1.8 |
| LVCMOS25 | 1 | 2.5 |
| LVCMOS33 | 1 | 3.3 |
| LVDS_33 | 2 | 3.3 |
| LVDSEXT_25 | 2 | 2.5 |
| LVPECL_33 | 2 | 3.3 |
| LVTTL | 1 | 3.3 |
| PCI33_3 | 1 | 3.3 |
| PCI66_3 | 1 | 3.3 |
| PCIX | 1 | 3.3 |
| SSTL18_I | 1 | 1.8 |
| SSTL18_II | 1 | 1.8 |
| SSTL2_I | 1 | 2.5 |
| SSTL2_II | 1 | 2.5 |
| SSTL3_I | 1 | 3.3 |
| SSTL3_II | 1 | 3.3 |
| ULVDS_25 | 2 | 2.5 |

The pin/ball location on the FPGA is specified using a constraint. The constraint identifies the buffer that will be located in a particular ball or pin. This specification may be entered in by the user during core generation. Also specified is the output buffer type. Therefore the only thing that is inside the trace core 104 is a generic buffer that is parameterized with FPGA constraints.

Adding the Trace Core

While a variety of FGPA tools exist that could be modified to add the trace core 104, the following discussion will be limited to the creation and addition using ChipScope tools. The trace core 104 may be added into an FPGA 101 by two methods, instantiation and insertion. Adding the trace core 104 by instantiation requires the SOC designer to modify their HDL and instantiate the trace core 104 into their design. The instantiated core is actually a black box design that will be connected during final FPGA place and route. An alternate method for adding trace core 104 is insertion using Xilinx's ChipScope Core Inseter tool. This tool takes a synthesized design, such as an SOC, and adds the trace core 104 using the design EDIF file. In this case the SOC HDL is not modified and the trace core 104 may be sized and connected using this core insertion tool.

When creating a trace core 104 six parameters, shown in Table 5, may prove useful. The first is the capture mode, which chooses between a state or timing core, e.g. the core 300 or 1000. The next parameter sets the number mux bank inputs. The driver end type sets whether the core output pads will be single or differential ended. The TDM parameter will either add TDM 308, when 2x is set, or leave it out, when 1x is set. The pin count sets the number of core pins that are probed by the logic analyzer. Finally the pin output parameter specifies the output voltage standard for each pin.

TABLE 5

| Parameter | Values |
|---|---|
| Capture Mode | State/Timing |
| Signal Bank Count | 1,2,4,8,16, or 32 |
| Driver End Type | Single/Differential |
| TDM Rate | 1x/2x |
| ATD Pin Count | 4-128 |
| Pin Parameters | Any output standard from Table 4 |

Instantiation flow is much like adding a component to an existing design. The first step is to generate the core. In generating the core, the user specifies the core parameters from Table 5. The CineScope product accepts the core parameters and creates three files, a core EDIF netlist, a core constraints file (NCF) and an example file. The netlist and constraint file are used by the FPGA place and route tools when building the design. The EDIF netlist is connected by the user by instantiating a black box design. The black box design can be written in Verilog or VHDL, and simply specifies the inputs and outputs of the core. The black box design has no simulation or synthesis HDL and is used to define the connectivity of the EDIF to the rest of the HDL. This implies two things: 1) the core is linked into the design after synthesis by the FPGA place and route tools and 2) the core does not have an HDL simulation model for pre-synthesis simulation.

Recall that the trace core 104 may use an additional core for communication called the ICON core. One parameter of the core 104 is the control port. This parameter specifies how many debug cores attach to this bus. Another parameter is the global buffer, or BUFG, option. This parameter specifies whether this special routing resource can be used by the ICON. Finally, the ICON BSCAN options allow you to specify if the unit is instantiated in the core, which user port is used, and if unused ports are made available to the design. Again, the output of the tool is three files, the EDIF, NCF, and an example file.

Once these two components are created, they are embedded in the design by instantiation. For example the user may instantiate the core in their HDL as shown in Table 6. The ICON core connects to the trace core 104 through the control0 bus. The user clock, called intClk in this example, is connected to the clk port of the trace core 104. Finally the input banks are connected. In this example only one bank is shown and thus the wavyCount00 signal is connected to bank 0 input called data0.

TABLE 6

```
// icon core (dynamic probe system 100 communication core)
icon u_icon(.control0(control0));
// atc2 core (trace core)
atc2
       u_atc2
       (// inputs
           .control(control0),
           .clk(intClk),
           .data0(wavyCount00)
       );
```

The normal FPGA build flow continues after the core is inserted. The HDL design must be synthesized because it was modified when the trace core 104 was instantiated. After synthesis then the FPGA place and route tools are executed. The one difference in the backend tools is that now the location of the trace core 104 and ICON EDIF and NCF files must be specified. By default the top level build directory is used as the repository for all black box designs. Therefore by simply copying the ICON and trace core 104 EDIF and NCF files to the build directory is sufficient for the backend to fill the black boxes with these netlists.

FIG. 13 is a flow chart of a method in accordance with an embodiment of the present invention. The core generation flow for trace core 104 adds two steps to the standard FPGA build flow. The first step 1302 is to generate the ICON and trace cores. After these are created the second step 1304 requires modification of the HDL. Following this step the flow for the SOC designer is exactly the same as for a standard FPGA design. In step 1306 the SOC is synthesized. In step 1308, the SOC is placed and routed. Finally in step 1310, the FPGA bit stream is generated.

The trace core instantiation flow is simple to understand and conceptually works well with the SOC designer and integrator. The idea of instantiating a trace core 104 complements the standard SOC design practice of simply connecting wires from one core to another. However because the trace core 104 is, in effect, a debug core, it does not lend itself well to the concept of probing signals deeply immersed in a core. In fact, with the instantiation flow the user routes internal signals to some top level where the trace core 104 is instantiated. This process of routing out signals to a top level can be very cumbersome, error prone, and time consuming. For this reason core insertion may be used instead of core instantiation.

Core insertion inserts debug cores into an existing design. Xilinx's Core Inserter reads an EDIF from a synthesized design. The Core inserter then graphically aids the user in adding and connecting the core, in this cast the trace core. The process is encompassed in interview type format where the user starts by specifying the ICON settings followed by adding a trace core. The user adjusts the trace core parameters and finally the user connects the mux bank inputs to signals inside the design.

The signal connection is done with the core inserter GUI that allows the user to select SOC signals and attach them to specific banks for probing. These signals are the wires and registers in the SOC design. The user must specify the synthesized SOC EDIF netlist to the tool prior to adding cores. When the tool reads this file the signals are identified and used for probing. For trace core 104 signal connection, the signals are presented to the user in a selectable list. This list is organized in a hierarchical tree so that the user can easily traverse the hierarchy of instantiated design units and select specific signals for a particular bank. Thus the signal connection of the inserter is very powerful because the user never modifies the SOC HDL to route out signals for trace core probing. With the inserter all the internal SOC registers and wires are accessible.

The inserter tool also handles the process of connecting the ICON with the trace core 104. Once the user has completed adding and connecting the trace core the parameters are saved in a CDC file and passed to the Xilinx place and route tool. The inserter tool is part of the Xilinx FPGA integrated build tool, called ISE. ISE gives the user an FPGA project build environment from which they can create the FPGA design starting with synthesis and going all the way through to bit file generation. A core inserter project file, known as a CDC, can be added to this flow. When added, the core inserter GUI is used to add and configure the trace core 104. When the core inserter is exited, the core connections and configurations are saved in the CDC, which is now part of the current ISE FPGA build project. Upon rebuilding the FPGA this CDC file is used by ISE to add and connect trace core 104 to the synthesized design. It will do this operation every time the FPGA is built. If the user wants to remove the trace core 104 all they have to do is remove the CDC from the ISE FPGA build project. If they want to change the connections they simply start the core inserter GUI, modify the connections, resave the CDC file, and rebuild the FPGA.

FIG. 14 is a flow chart of a method in accordance with an embodiment of the present invention. The core instantiation flow of the trace core 104 adds one step to the standard FPGA build flow. This step (step 1404) occurs after synthesis step 1402 prior to the place and route step 1406. One important distinction between this and core generation is with core regeneration. In step 1404, the core inserter is used to insert the core and make signal connections. Finally, in step 1408, the FPGA bit stream is generated. If the debug core needs to be changed, core generation flow requires regenerating the core, possibly changing the HDL, and re-synthesis. However if core inserter flow is used then no re-synthesizing is necessary, just run core inserter and re-run place and route.

Although several embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A dynamic probe comprising:
   a FPGA with at least one core;
   a debugging trace core having a multiplexer included in the FPGA, the trace core in communication with a plurality of signal banks, each signal bank comprising a plurality of signals in the at least one core, the multiplexer dynamically accessing the plurality of signal banks during test; and
   a logic analyzer external to the FPGA, in communication with the trace core and selecting the bank of signals to be sent from the trace core to the logic analyzer.

2. A dynamic probe, as set forth in claim 1, further comprising a JTAG compliant link between the trace core and the logic analyzer, the logic analyzer sending control data to the trace core via the JTAG compliant link to select the bank of signals to be sent from the trace core to the logic analyzer.

3. A dynamic probe, as set forth in claim 2, further comprising a data link between the FPGA and the logic analyzer over which the plurality of signals of the selected signal bank are sent from the FPGA to the logic analyzer.

4. A dynamic probe, as set forth in claim 1 wherein the trace core includes a set of core registers used for control of the trace core.

5. A dynamic probe, as set forth in claim 4, wherein the logic analyzer sets at least one register in the set of core registers to select the bank of signals to be sent from the trace core to the logic analyzer.

6. A dynamic probe, as set forth in claim 4, wherein the core registers store status information about the trace core.

7. A dynamic probe, as set forth in claim 1, wherein the trace core comprises:
   a first switch receiving signals from the plurality of signal banks, the first switch outputting signals from a selected bank.

8. A dynamic probe, as set forth in claim 7, wherein the trace core further comprises:
   a data calibration unit connected to the first switch that selects between a calibration signal and the output of the first switch.

9. A dynamic probe, as set forth in claim 8, wherein the data calibration unit comprises:
   a test pattern generator that, responsive to a clock signal from a core on the FPGA, outputs a test pattern over a plurality of channels corresponding to the number of signals in a signal bank; and
   a second switch connected to the test pattern generator and the output of the first switch, the second switch outputting a selected one of the output of the first switch and the test pattern generator.

10. A dynamic probe, as set forth in claim 7, further comprising:
    a signal buffer connected to the first switch that receives the signals of the plurality of signal banks and outputs the signals to the multiplexer.

11. A dynamic probe, as set forth in claim 7, further comprising registers connected to the output of the first switch.

12. A dynamic probe, as set forth in claim 7, wherein the first switch comprises a bank multiplexer.

13. A dynamic probe, as set forth in claim 9, wherein the second switch comprises a multiplexer.

14. A dynamic probe, as set forth in claim 7, further comprising:
    a time division multiplexing unit connected to the output of the first switch and a clock signal from the at least one core, the time division multiplexing unit accelerating the delivery of data from the trace core to the logic analyzer.

15. A dynamic probe, as set forth in claim 14, wherein the time division multiplexing unit comprises double data rates registers that output a signal from a first channel at the leading edge of the clock signal and a signal from a second channel at the trailing edge of the clock signal.

16. A dynamic probe, as set forth in claim 14, wherein the trace core further comprises:
    a data calibration unit connection to the first switch that outputs a selected one of a calibration signal and the output of the first switch to the time division multiplexing unit.

17. A method of testing an FPGA, the method comprising:
    identifying a plurality of signal banks in the FPGA, each signal bank comprising a plurality of signals obtained from within the FPGA;
    adding a bank multiplexer to the FPGA, the bank multiplexer in communication with an external logic analyzer and the plurality of signal banks, the bank multiplexer dynamically accessing the plurality of signal banks during test;
    sending a control signal from the logic analyzer to the bank multiplexer to select one of the signal banks for testing;
    based on the control signal, switching the bank multiplexer to output the selected signal bank; and
    analyzing the signals of the selected signal bank on the logic analyzer.

18. A method, as set forth in claim 17, wherein the step of sending a control signal comprises sending a signal via a serial communication path instructing the FPGA to place a value in a register that causes the bank multiplexer to select one of the signal banks.

19. A method, as set forth in claim 18, wherein the serial communication path comprises a JTAG compliant communication path.

20. A method, as set forth in claim 17, further comprising:
    time division multiplexing the output of the bank multiplexer to accelerate the data transfer rate to the logic analyzer.

21. A method, as set forth in claim 17, further comprising:
    generating a test signal on the FPGA, the test signal configured to facilitate calibration of the logic analyzer.

22. A method, as set forth in claim 21, further comprising:
    sending ond of the output of the bank multiplexer and the test signal to the logic analyzer.

23. A method, as set forth in claim 17, further comprising:
    transmitting the signals from the bank multiplexer to the logic analyzer based on a clock signal; and
    supplying the clock signal to the logic analyzer.

24. A method, as set forth in claim 23, further comprising:
    time division multiplexing the output of the bank multiplexer based on the lock signal to accelerate the data transfer rate to the logic analyzer.

25. A method, as set forth in claim 17, wherein the step of adding a bank multiplexer comprises instantiating the bank multiplexer.

26. A method, as set forth in claim 17, wherein the step of adding a bank multiplexer comprises inserting the bank multiplexer.

27. An FPGA comprising:
  a plurality of cores;
  a plurality of debugging pins; and
  debugging trace core means including a multiplexer, connected to a plurality of signals in the FPGA, the debugging trace core means segregating the plurality of signals into as plurality of banks of signals and, based on an instruction originating external to the FPGA, dynamically outputting a single bank of signals to the plurality of debugging pins.

* * * * *